(12) United States Patent
Johnson et al.

(10) Patent No.: US 10,796,885 B2
(45) Date of Patent: Oct. 6, 2020

(54) CIRCUIT FOR IMPEDANCE MATCHING BETWEEN A GENERATOR AND A LOAD AT MULTIPLE FREQUENCIES, ASSEMBLY COMPRISING SUCH A CIRCUIT AND RELATED USE

(71) Applicants: Centre National de la Recherche Scientifique, Paris (FR); Ecole Polytechnique, Palaiseau (FR)

(72) Inventors: Erik Johnson, Paris (FR); Jean-Paul Booth, Boullay les Trous (FR)

(73) Assignees: Centre National de la Recherche Scientifique, Paris (FR); Ecole Polytechnique, Palaiseau (FR)

( * ) Notice: Subject to any disclaimer, the term of this patent is extended or adjusted under 35 U.S.C. 154(b) by 0 days.

(21) Appl. No.: 16/347,736

(22) PCT Filed: Nov. 8, 2017

(86) PCT No.: PCT/EP2017/078673
§ 371 (c)(1),
(2) Date: Aug. 20, 2019

(87) PCT Pub. No.: WO2018/087189
PCT Pub. Date: May 17, 2018

(65) Prior Publication Data
US 2019/0393018 A1      Dec. 26, 2019

(30) Foreign Application Priority Data

Nov. 8, 2016   (FR) .................................... 16 60791

(51) Int. Cl.
*H01J 37/32* (2006.01)
*H03H 7/40* (2006.01)

(52) U.S. Cl.
CPC .. *H01J 37/32183* (2013.01); *H01J 37/32091* (2013.01); *H03H 7/40* (2013.01)

(58) Field of Classification Search
None
See application file for complete search history.

(56) References Cited

U.S. PATENT DOCUMENTS

| 3,461,372 | A | 8/1969 | Pickup et al. |
| 4,679,007 | A | 7/1987 | Reese et al. |
| 2007/0021088 | A1 | 1/2007 | Sheng-Fuh et al. |
| 2008/0079513 | A1 | 4/2008 | Prikhodko et al. |
| 2012/0075033 | A1 | 3/2012 | Ouyang et al. |
| 2012/0105147 | A1 | 5/2012 | Harris et al. |
| 2012/0306367 | A1 | 12/2012 | Kim et al. |

FOREIGN PATENT DOCUMENTS

| JP | 2002-118428 A | 4/2002 |
| WO | 2013/067031 A2 | 5/2013 |

OTHER PUBLICATIONS

International Search Report issued in corresponding International Patent Application No. PCT/EP2017/078673 dated Mar. 8, 2018.

*Primary Examiner* — Jany Richardson
(74) *Attorney, Agent, or Firm* — Morgan, Lewis & Bockius LLP

(57) ABSTRACT

The invention relates to a circuit (100) able to achieve simultaneous impedance matching between a generator (G) and a load (CH) for a power supply signal comprising at least two distinct frequencies.

11 Claims, 12 Drawing Sheets

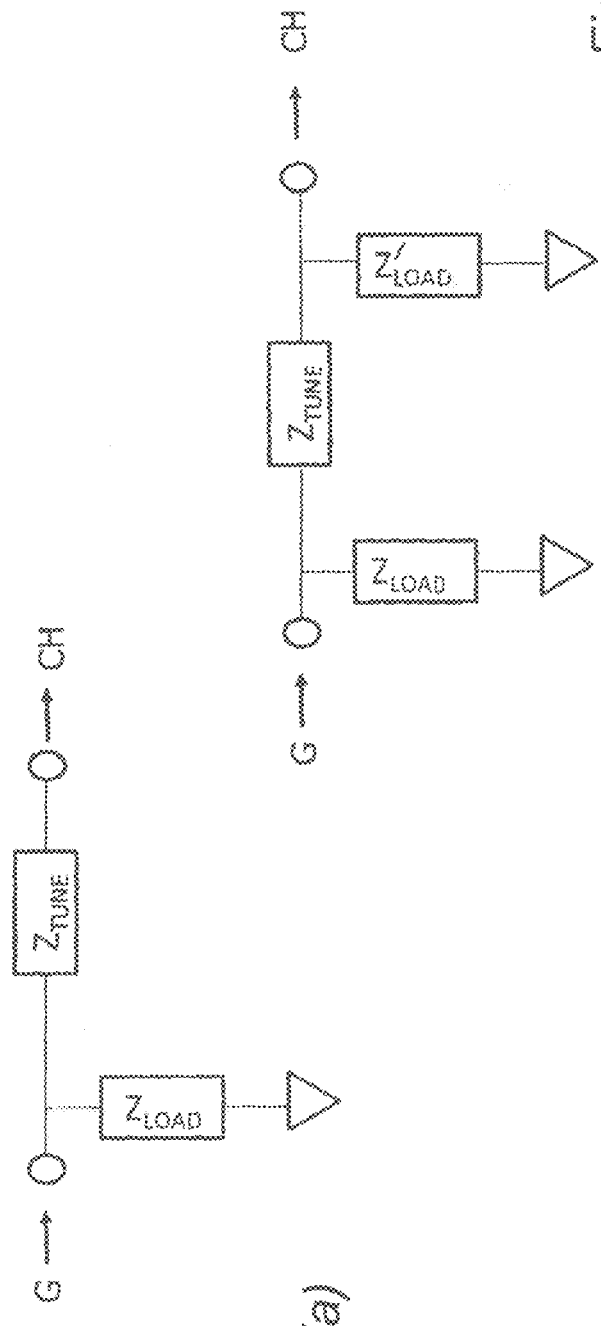
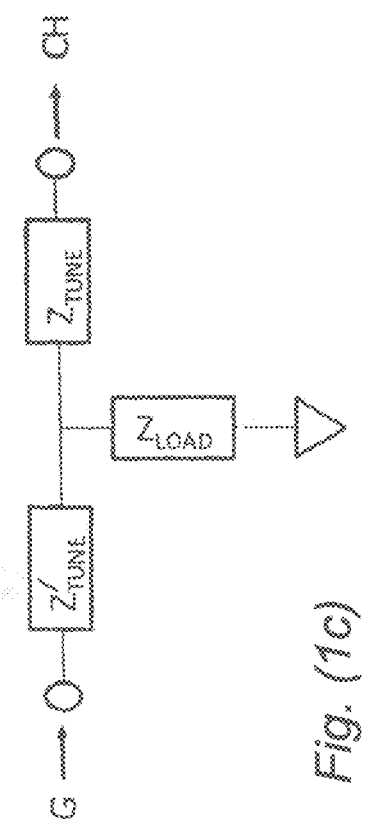
Fig. 1(a)
Fig. 1(b)
Fig. (1c)

CIRCUIT FOR IMPEDANCE MATCHING BETWEEN A GENERATOR AND A LOAD AT MULTIPLE FREQUENCIES, ASSEMBLY COMPRISING SUCH A CIRCUIT AND RELATED USE

The invention relates to a circuit for impedance matching between a generator and a load at multiple frequencies.

The invention also relates to an assembly comprising a generator, a load and a circuit for impedance matching arranged between the generator and the load.

It also relates to the use of such an assembly.

The invention can be applied in various fields, and more particularly for a load formed by a capacitively-coupled plasma reactor.

In this case, conventionally use is made of a generator powering the capacitively-coupled plasma reactor with a sinusoidal signal (voltage), typically in the radiofrequency range (RF), i.e. between 1 MHz and 900 MHz. Because the impedance characteristics of a capacitively-coupled plasma reactor are variable and generally different from that of the generator, a load and tuning stage is used between the generator and the plasma reactor for (electrical) impedance matching purposes.

The purpose of this impedance matching is to maximise the power transmitted by the generator to the capacitively-coupled plasma reactor.

FIGS. 1(a) to 1(c) show three possible configurations to achieve such impedance matching (at a single frequency).

In FIG. 1(a), the impedance matching stage comprises an L-shaped circuit, provided with a tuning impedance $Z_{TUNE}$ arranged in series between the generator G and the plasma reactor CH and a load impedance $Z_{LOAD}$ arranged between the generator G and the earth (represented by a triangle).

In FIG. 1(b), the circuit is π-shaped and is obtained by adding, with respect to the L-shaped configuration of FIG. 1(a), another load impedance $Z'_{LOAD}$ arranged in parallel between the load CH and the earth (represented by a triangle) so that the tuning impedance $Z_{TUNE}$ is arranged between two load impedances $Z_{LOAD}$, $Z'_{LOAD}$.

In FIG. 1(c), the circuit is T-shaped and obtained by adding, with respect to the L-shaped configuration of FIG. 1(a), another tuning impedance $Z'_{TUNE}$ arranged in series between the generator G and the circuit of FIG. 1(a). In other words, the circuit therefore comprises another tuning impedance $Z'_{TUNE}$ arranged in series between the generator G and the load CH so that the load impedance $Z_{LOAD}$ is arranged between the two tuning impedances $Z_{TUNE}$ and $Z'_{TUNE}$.

FIGS. 1(a) to 1(c) are provided as examples and other configurations can be considered.

Regardless of the configuration considered, the commonality between these different possible configurations resides in that the circuit is provided, as a minimum, with a tuning impedance $Z_{TUNE}$ and with a load impedance $Z_{LOAD}$. These impedances $Z_{TUNE}$, $Z_{LOAD}$ represent the impedances of capacitors ($Z_C=1/(j\omega C)$) or inductors ($Z_L=j\omega L$) used for that purpose, at the operating frequency f ($f=(2\pi)/\omega$) of the generator (sinusoidal signal).

As a consequence thereof, and because the power supply signal of the plasma reactor features a given frequency f (that of the sinusoidal signal) it is possible to achieve impedance matching without encountering any specific issues.

Many coupled plasma reactors continue to implement this solution to achieve impedance matching between the generator and the reactor.

However, solutions have been sought, whereby such a plasma reactor is able to operate with a power supply signal at multiple frequencies.

Indeed, it has already been shown that the use of a power supply signal at multiple frequencies for such a plasma reactor helped improve the performance and control of the reactor. For example, document WO2012/007483 A1 discloses a power supply for a capacitively-coupled plasma reactor with a generator providing a periodic trapezoidal power supply signal (which can be broken down into a fundamental frequency and its harmonics). The control of the waveform of the power supply signal (trapezoidal waveform and periodicity) therefore enables controlling independently the ion bombardment and the injected power.

This is very interesting.

However, from a practical (industrial) standpoint, the power injected by the generator needs to be efficiently transferred to the plasma reactor.

Therefore, a known solution is to achieve impedance matching with as many generators and load and tuning stages comprising a circuit similar to that shown in FIGS. 1(a) to 1(c) as there are (multiple) frequencies to be managed in the signal. In this case, each generator, with which is associated a circuit such as shown in FIGS. 1(a) to 1(c), forms an assembly operating on a given frequency, the different assemblies thereby formed being arranged in parallel and connected to the plasma reactor. Therefore, it is also necessary to provide filters for each assembly such as defined above, to prevent a return of a given frequency signal, through the plasma reactor, and coming from another assembly. Therefore, if the intention is to process N (N>1) frequencies, N assemblies such as defined above must be provided, with N−1 filters per assembly, i.e. N(N−1) filters. Furthermore, this solution requires an independent generator/amplifier for each frequency.

This solution may work, but it can be burdensome in its implementation and costly.

Other solutions are therefore currently sought, enabling not only to achieve impedance matching at multiple frequencies, but also, contrary to the solution described above, to implement a single generator and a reduced amount of components to achieve impedance matching between the generator and the plasma rector.

A first step in this direction was completed with the invention disclosed in document WO 2013/186381.

In this document, the disclosed solution consists in providing a circuit for impedance matching between a single generator and the plasma reactor, the circuit being of a particular design in which at least one component, (a capacitor for example) has an adjustable value. A difficulty encountered with this solution is that when impedance matching is conducted (according to the example, by setting the capacity value of the capacitor), for a given frequency (harmonic for example), it causes an impedance change in another frequency (fundamental frequency for example).

Although this solution achieves impedance matching with an acceptable transmission of power between the generator and the plasma reactor, it remains difficult to control.

This is also the case for an application with a capacitively-coupled plasma generator and more generally for any load.

An object of the present invention is therefore to provide a circuit for impedance matching between a generator and a load at multiple frequencies and featuring improved performance.

For this purpose, the invention relates to a circuit for impedance matching able to perform simultaneous impedance matching between a generator and a load for a power supply signal comprising at least a first frequency and a second frequency, distinct from one another, said circuit comprising a stage of impedance matching able to achieve impedance matching between the generator and the load for the first frequency, this stage comprising a circuit comprising at least one tuning impedance intended to be arranged in series between the generator and the load, and a load impedance intended to be arranged between the generator and an earth, characterised in that said circuit for impedance matching further comprises at least one pair of additional stages able to achieve impedance matching, simultaneously, between the generator and a load for the second frequency, said additional pair of stages comprising:

- a first additional stage comprising a load circuit arranged in parallel with respect to the load impedance of the impedance matching stage, said load circuit comprising at least an inductor and a capacitor arranged in series, and
- a second additional stage comprising a tuning circuit arranged in series with respect to the tuning impedance of the impedance matching stage, said tuning circuit comprising at least an inductor and a capacitor arranged in parallel,
- the impedance matching stage furthermore being arranged between the first additional stage and the second additional stage.

This circuit can have at least one of the following characteristics:

- at least a supplementary pair of additional stages able to achieve impedance matching, simultaneously between the generator and the load for a third frequency, distinct from said first and second frequencies, said at least one supplementary pair of additional stages, comprising:
- a first supplementary additional stage comprising a load circuit arranged in parallel with respect to the load impedance of the impedance matching stage, said load circuit comprising at least an inductor and a capacitor arranged in series, and
- a second supplementary additional stage comprising a tuning circuit arranged in series with respect to the tuning impedance of the impedance matching stage, said tuning circuit comprising at least an inductor and a capacitor arranged in parallel, and
- the assembly formed by the impedance matching stage and by the pair of additional stages furthermore being arranged between the first supplementary additional stage and the second supplementary additional stage;
- the value of at least either the inductor or of the capacitor of at least one of the additional stages is adjustable;
- the circuit of the impedance matching stage comprises a tuning impedance intended to be arranged in series between the generator and the load, and a load impedance intended to be arranged between the generator and said earth;
- the tuning impedance comprises an inductor arranged in series with a capacitor and the load impedance comprises a capacitor;
- the tuning impedance consists of an inductor arranged in series with a capacitor and the load impedance is consists of a capacitor;
- the circuit further comprises another load impedance intended to be arranged between said load and said earth so that the tuning impedance is arranged between the two load impedances;
- the circuit further comprises another tuning impedance intended to be arranged in series between the generator and the load so that the load impedance is arranged between the two tuning impedances.

The invention also proposes an assembly comprising:
a load, and
a generator able to transmit to the load a power supply signal comprising at least a first frequency and a second frequency, the frequencies being distinct from one another,
characterised in that said assembly further comprises a circuit for impedance matching according to the invention arranged between the generator and the load so that, on one hand, the first additional stage that comprises the outermost load circuit of said circuit for impedance matching is connected to the generator, and on the other hand, the second additional stage that comprises the outermost tuning circuit of said circuit for impedance matching is connected to the load.

The assembly can also feature at least one of the following characteristics, taken individually or in combination:
- the first frequency is a fundamental frequency of said power supply signal and the second frequency, and as necessary any additional frequency, is one of its harmonics;
- a frequency sensor located between the generator and said circuit for impedance matching;
- the load is a capacitively-coupled plasma generator.

Finally, the invention proposes a use of an assembly according to the invention provided with said frequency sensor and wherein the load is a capacitively-coupled plasma generator, use wherein the generator transmits a power supply signal comprising a single frequency towards the capacitively-coupled plasma generator, and wherein the frequency data from the frequency sensor is analysed, at its return from the capacitively-coupled plasma reactor, to determine whether the etching process in progress in the plasma reactor is completed or not.

BRIEF DESCRIPTION OF THE DRAWINGS

Other characteristics, purposes and advantages of the invention will be revealed upon reading the following description made in reference to the appended drawings, provided by way of examples, wherein:

FIGS. 1(a) to 1(c) show three possible configurations to achieve impendence matching at a single frequency;

Figure 2:
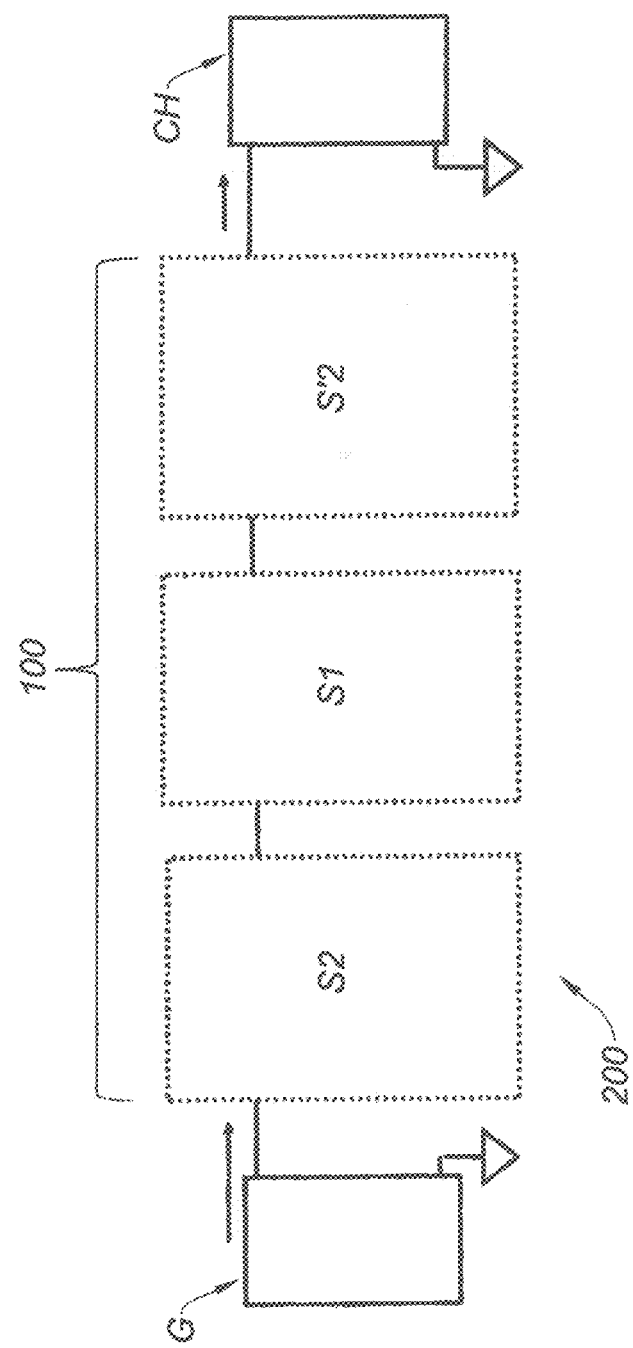
FIG. 2 shows a general diagram of an assembly according to the invention and comprising a generator, a load and, arranged between the generator and the load, a circuit for impedance matching.
Figure 3:
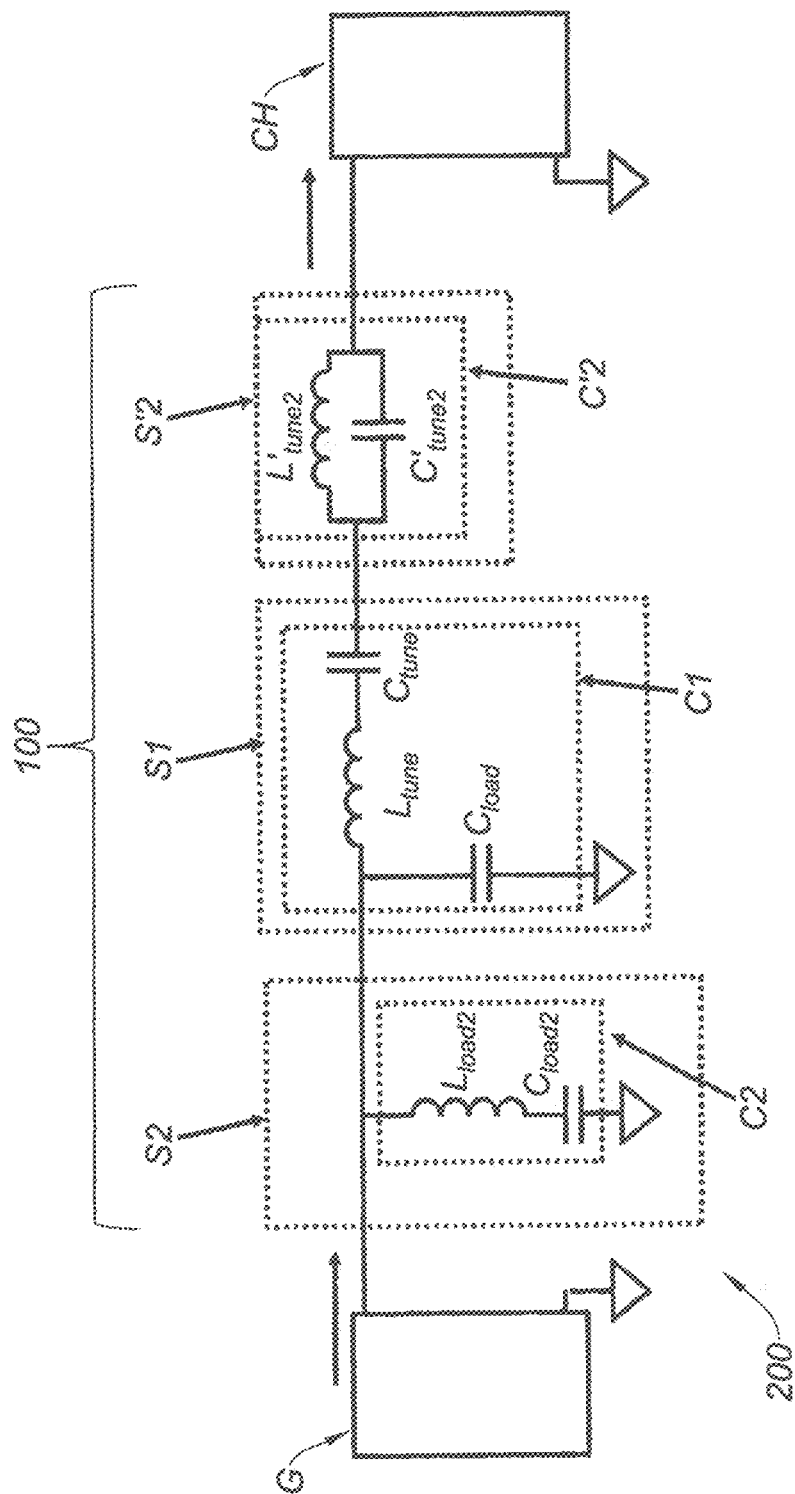
FIG. 3 shows a more accurate diagram of the embodiment shown in FIG. 2 according to the invention, wherein the components of the circuit for impedance matching are named.

An embodiment of the invention is shown in FIGS. 2 and 3.

These figures show an assembly 200 comprising a generator G, a load CH and a circuit for impedance matching 100 located between the generator G and the load CH.

The circuit for impedance matching 100 is able to achieve simultaneous impedance matching between the generator G and the load CH for a power supply signal comprising at least a first frequency and a second frequency distinct from one another.

This circuit for impedance matching 100 comprises an impedance matching stage S1 able to achieve impedance matching between the generator and the load for the first frequency.

This stage S1 comprises a circuit C1 similar to that shown in FIG. 1(a). Here, by way of example, the tuning impedance $Z_{TUNE}$ corresponds to an association, in series, of an inductance $L_{tune}$ and of a capacitor $C_{tune}$ and, furthermore, the load impedance $Z_{LOAD}$ corresponds to a load capacitor $C_{load}$.

This circuit for impedance matching 100 further comprises at least one pair of additional stages S2, S'2 able to achieve impedance matching, simultaneously, between the generator and the load for the second frequency.

More specifically, the pair of additional stages S2, S'2 comprises:
  a first additional stage S2 comprising a load circuit C2 arranged in parallel with respect to the load impedance $Z_{LOAD}$ (for example a capacitor $C_{load}$) of the impedance matching stage S1 said load circuit C2 comprising at least an inductor $L_{load2}$ and a capacitor $C_{load2}$ arranged in series, and
  a second additional stage S'2 comprising a tuning circuit C'2 arranged in series with respect to the load impedance $Z_{TUNE}$ (for example an inductor $L_{tune}$ in series with a capacitor $C_{tune}$) of the impedance matching stage S1, said load tuning C'2 comprising at least an inductor $L'_{tune2}$ and a capacitor $C'_{tune2}$ arranged in parallel,
  the load and tuning stage S1 furthermore being arranged between the first additional stage S2 and the second additional stage S'2.

In practice, the next step is to select the values of the capacitors and impedances to use in each circuit C1, C2, and C'2. This depends in particular on the nature and characteristics of the load CH.

Figure 4A:
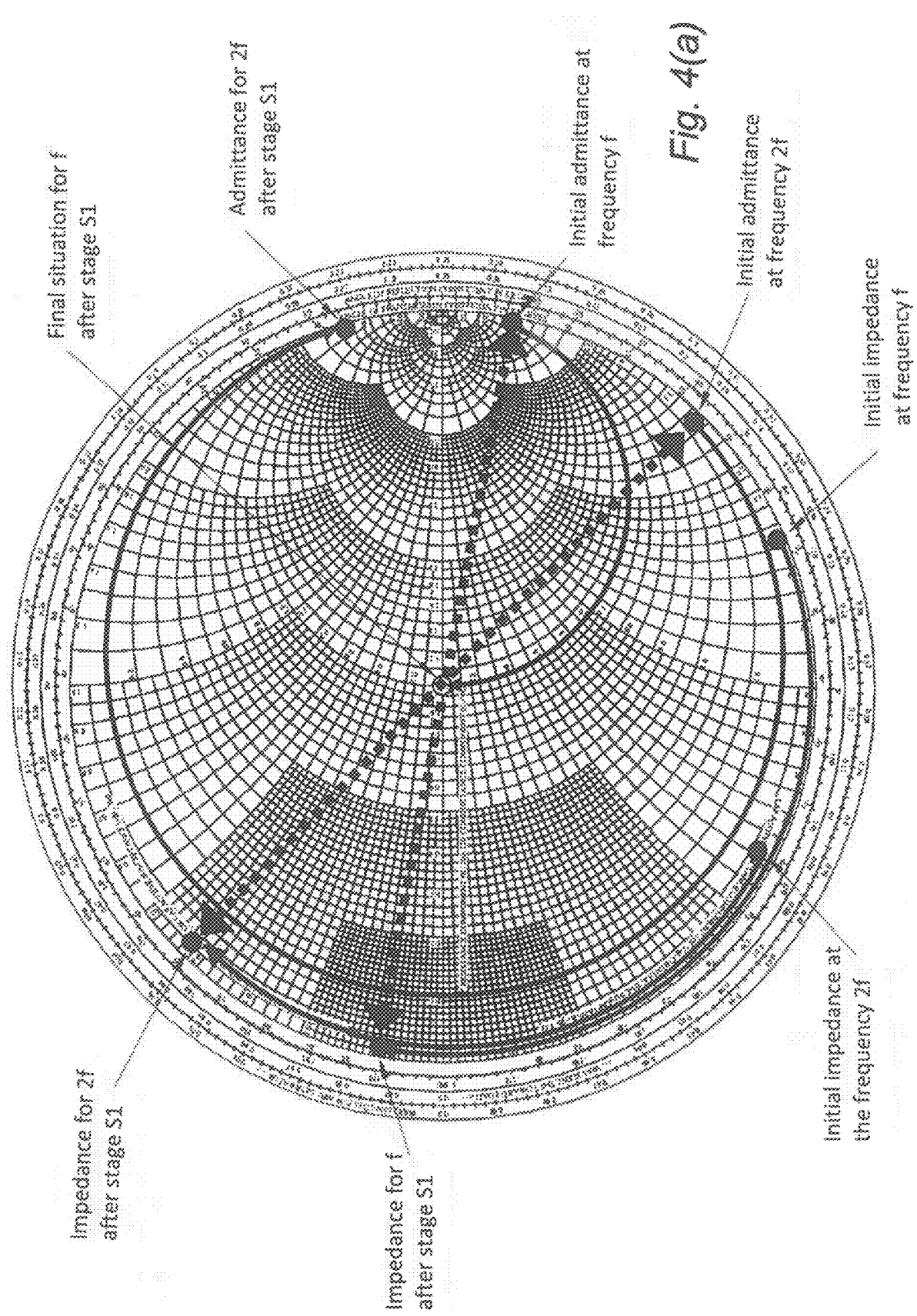
FIGS. 4(a) and 4(b) show in FIG. 4(a) the working principle of an embodiment without implementing the invention in a Smith chart and in FIG. 4(b) the working principle of the embodiment of FIG. 3, in a Smith chart.
Figure 4B:
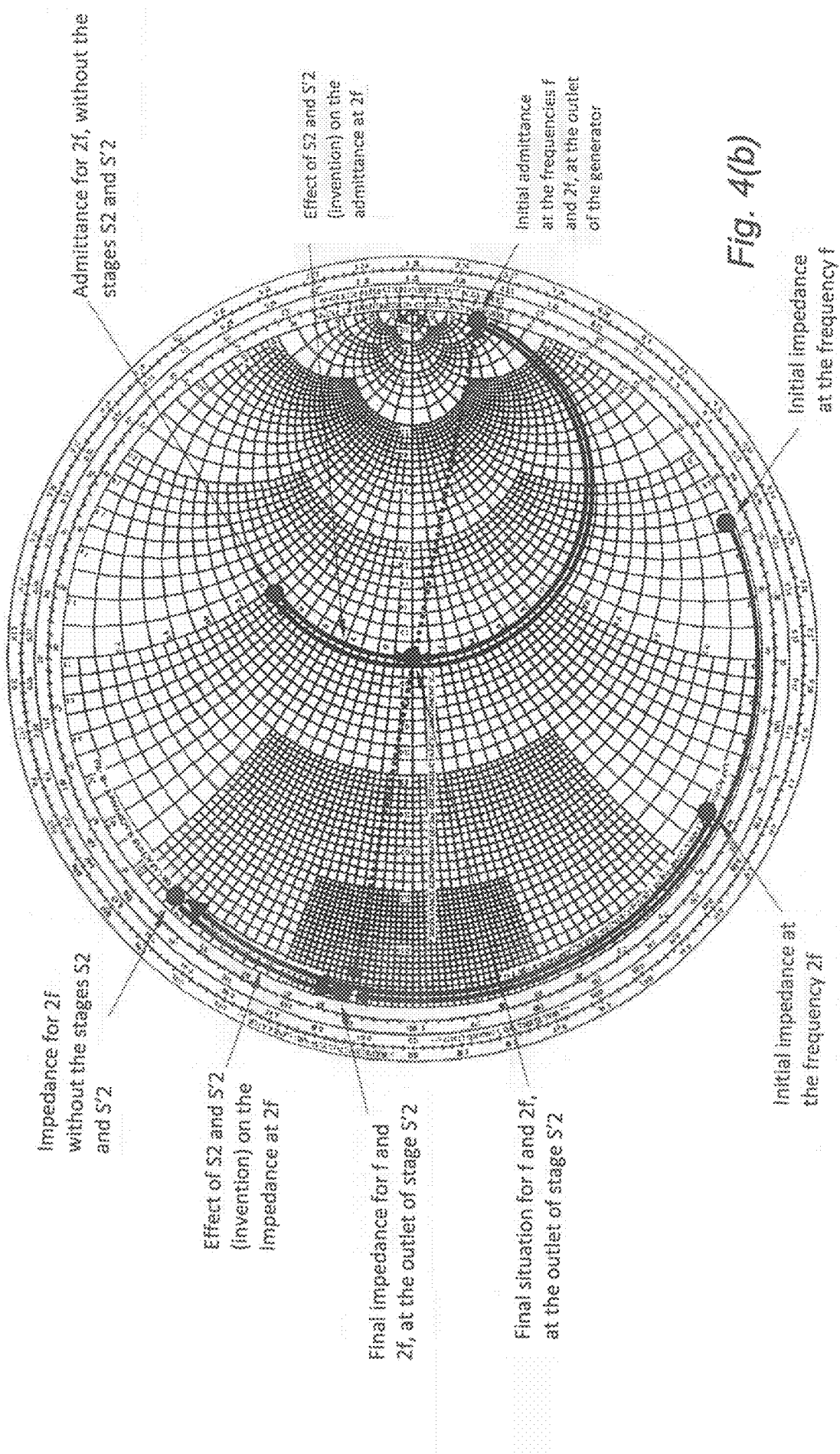

FIGS. 4(a) and 4(b) features a Smith chart explaining how the impedance matching works.

More specifically, FIG. 4(a) is a Smith chart without implementing the invention. For this reason, matching is achieved with a single stage, of the S1-type of FIG. 3, and therefore is included in the framework defined in FIG. 1(a), directly connected to the generator G and the load CH.

And FIG. 4(b) is a Smith chart implementing the invention, for example according to FIG. 3.

A Smith chart (abacus) shows the value of the real portion and the imaginary portion of an impedance (Z) or of an admittance (Y=1/Z). This representation is largely used in problems relating to impedance matching. Indeed, this representation is conducted in the complex field and more specifically in a plane (2D) of a complex reflection coefficient and is normalised, often with impedance, with admittance or with both in different domains to distinguish them.

For the application considered here, normalised impedance can be taken into account, with a value of 50 Ohms (the most commonly used). This corresponds, in FIGS. 4(a) and 4(b), to the small circle in the centre of the figure.

In FIG. 4(a), for the first frequency (fundamental), the effect of the stage S1 is noted. For example, for the impedance, the starting point is "initial impedance at the frequency f" (before the stage S1 and therefore at the output of the generator), and the arrow indicates the direction to follow. This is in all ways conventional. In this same FIG. 4(b), everything that occurs on the frequency 2f (first harmonic) is then noted, starting from the point "initial impedance at the frequency 2f" (before the stage S1 and therefore at the output of the generator) and following the arrow.

The impedance matching is of poor quality for the frequency 2f.

In FIG. 4(b), for the first frequency (fundamental), the effect of the stage S1 (impedance or admittance) alone is noted, i.e. without the stages S2 and S'2. For example, for the impedance, the starting point is "initial impedance at the frequency f", and the arrow indicates the direction to follow. This is identical to what occurs under these conditions in FIG. 4(a). In the same FIG. 4(b), everything that occurs on the frequency 2f (first harmonic) is then noted, with only one conventional stage S1, i.e. without the stages S2 and S'2 (FIGS. 2 and 3). For example, for the impedance, the starting point is "initial impedance at the frequency 2f", and the arrow indicates the direction to follow. This behaviour is similar to that described previously in FIG. 4(a).

The impedance matching is therefore of poor quality for the frequency 2f (small uppermost circles in FIG. 4(b)).

It is from here that FIG. 4(b) differs notably from FIG. 4(a).

Indeed, in the same FIG. 4(b), the technical effect of the implementation of stages S2 and S'2, as proposed by the invention, on the frequency 2f is noted.

The operating point (admittance, impedance) is, for this frequency 2f, brought to that of the frequency f, which is managed by the stage S1. The impedance matching at the frequency 2f is therefore of very good quality and even of a quality similar to that achieved in the case of a single frequency (conventional configuration).

Finally, it is noted that in this FIG. 4(b), that the impedance matching achieved for the frequency 2f has no impact on the impedance matching at the frequency f. There is independence between the management of impedance matching on those two frequencies. This independence is not necessarily absolute, but it can be determined by the finesse of the frequency response of the circuits (quality factor "Q") in the stages S2 and S'2.

The design proposed in FIGS. 2 and 3, adapted to manage two distinct frequencies, can be generalised to N (N>2) distinct frequencies.

Figure 5:
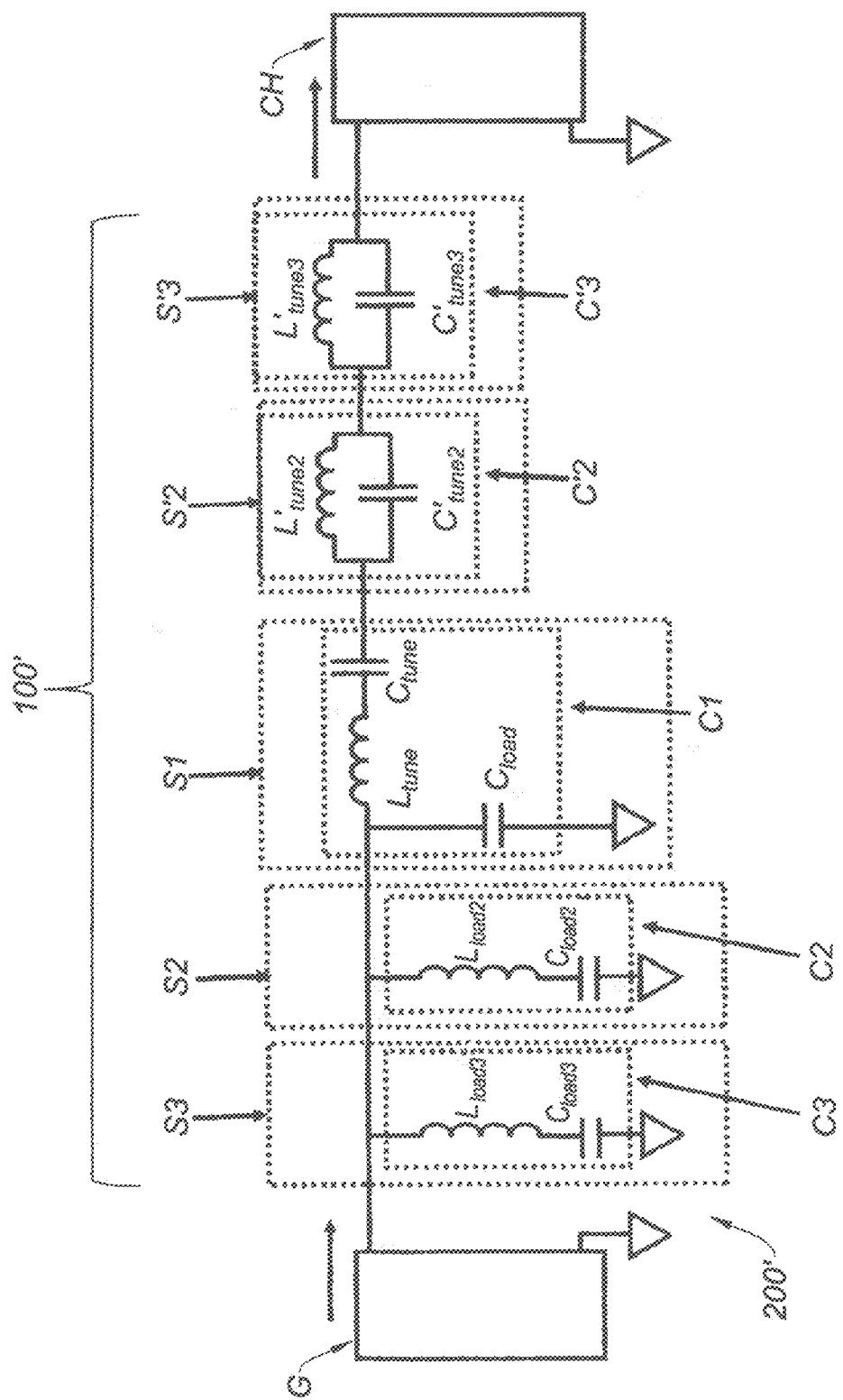
FIG. 5 shows another embodiment according to the invention.

FIG. 5 shows another embodiment, illustrating in practice how to manage a third frequency (N=3 case), distinct from the two first frequencies.

This other embodiment is based on the embodiment of FIG. 3 and shows where and how to add components to process a third frequency, distinct from the two first frequencies.

Thus, in addition to the components of the circuit 100 for impedance matching described above, the circuit 100' for impedance matching provided in this case comprises at least a supplementary pair of additional stages S3, S'3 able to achieve impedance matching, simultaneously, between the generator G and the load CH for a third frequency distinct from said first and second frequencies.

More specifically, said at least one supplementary pair of additional stages S3, S'3 comprises:
  a first supplementary additional stage S3 comprising a load circuit C3 arranged in parallel with respect to the load impedance $Z_{LOAD}$ (for example a capacitor $C_{load}$) of the impedance matching stage S1, said load circuit C3 comprising at least an inductor $L_{load3}$ and a capacitor $C_{load3}$ arranged in series, and a second supplementary additional stage S'3 comprising a tuning circuit C'3 arranged in series with respect to the load impedance $Z_{TUNE}$ (for example an inductor $L_{tune}$ in series with a capacitor $C_{tune}$) of the impedance matching stage S1, said load tuning C'3 comprising at least an inductor $L'_{tune3}$ and a capacitor $C'_{tune3}$ arranged in parallel.

the assembly formed by the impedance matching stage S1 and by the supplementary pair of additional stages S2, S'2 furthermore being arranged between the first supplementary additional stage S3 and the second supplementary additional S'3 stage.

In practice, the values of the inductors and capacitors of the circuits C3 and C'3 are selected to ensure good quality impedance matching for the third frequency (3f, for example).

As indicated previously, this can be generalised to other frequencies (N>3).

Each time, a stage that is similar, by its design, to the stage S2 should be added at the output of the generator G and a stage that is similar, by its design, to the stage S'2 should be added before the input of the load CH.

With the circuits 100, 100' for impedance matching described above, an assembly 200, 200' can be constructed, said assembly comprising:

a load CH, and a generator G able to transmit to the load a power supply signal comprising at least a first frequency and a second frequency, the frequencies being distinct from one another, wherein said assembly 200, 200' further comprises a circuit 100, 100' for impedance matching according to one of the preceding claims arranged between the generator G and the load CH so that, on one hand, the first additional stage S2, S3 that comprises the outermost load circuit C2, C3 of said circuit 100, 100' for impedance matching is connected to the generator G, and on the other hand, the second additional stage S'2, S'3 that comprises the outermost tuning circuit C'2, C'3 of said circuit 100, 100' for impedance matching is connected to the load CH.

In this assembly 200, 200', the first frequency can be a fundamental frequency of said power supply signal and the second frequency, and/or as necessary any additional frequency, is one of its harmonics.

The load CH can be a capacitively-coupled plasma generator. Alternatively, it can also be another electrical load with a characteristic impedance value that is different from that of the generator G, for example an antenna, a cable, and amplifier or an isolating circuit, a transducer, a coil, or an inductively-coupled plasma reactor.

Figure 6A:
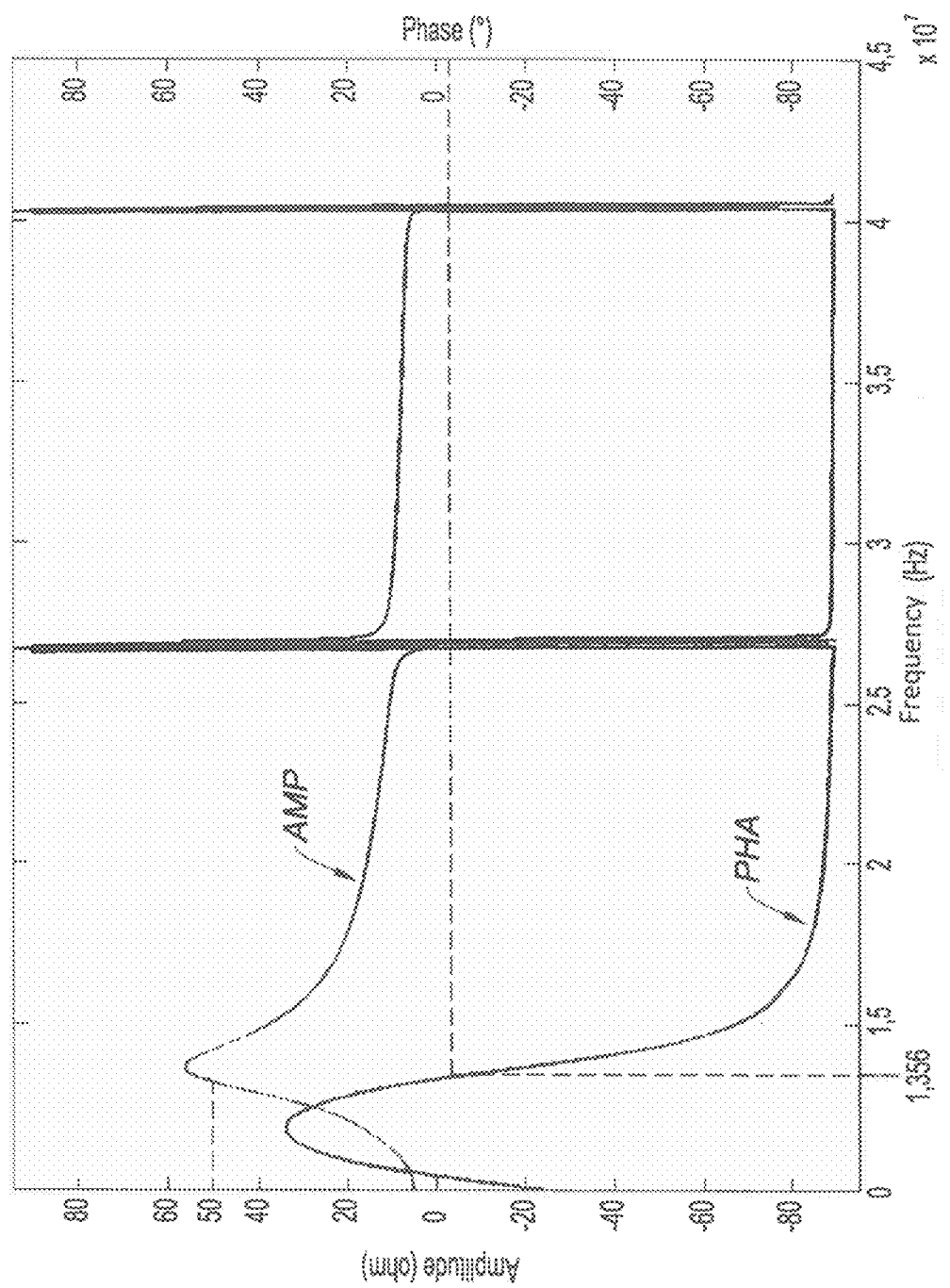
FIGS. 6(a), 6(b) and 6(c) show the results of a theoretical simulation of the behaviour of embodiment of FIG. 5.
Figure 6B:
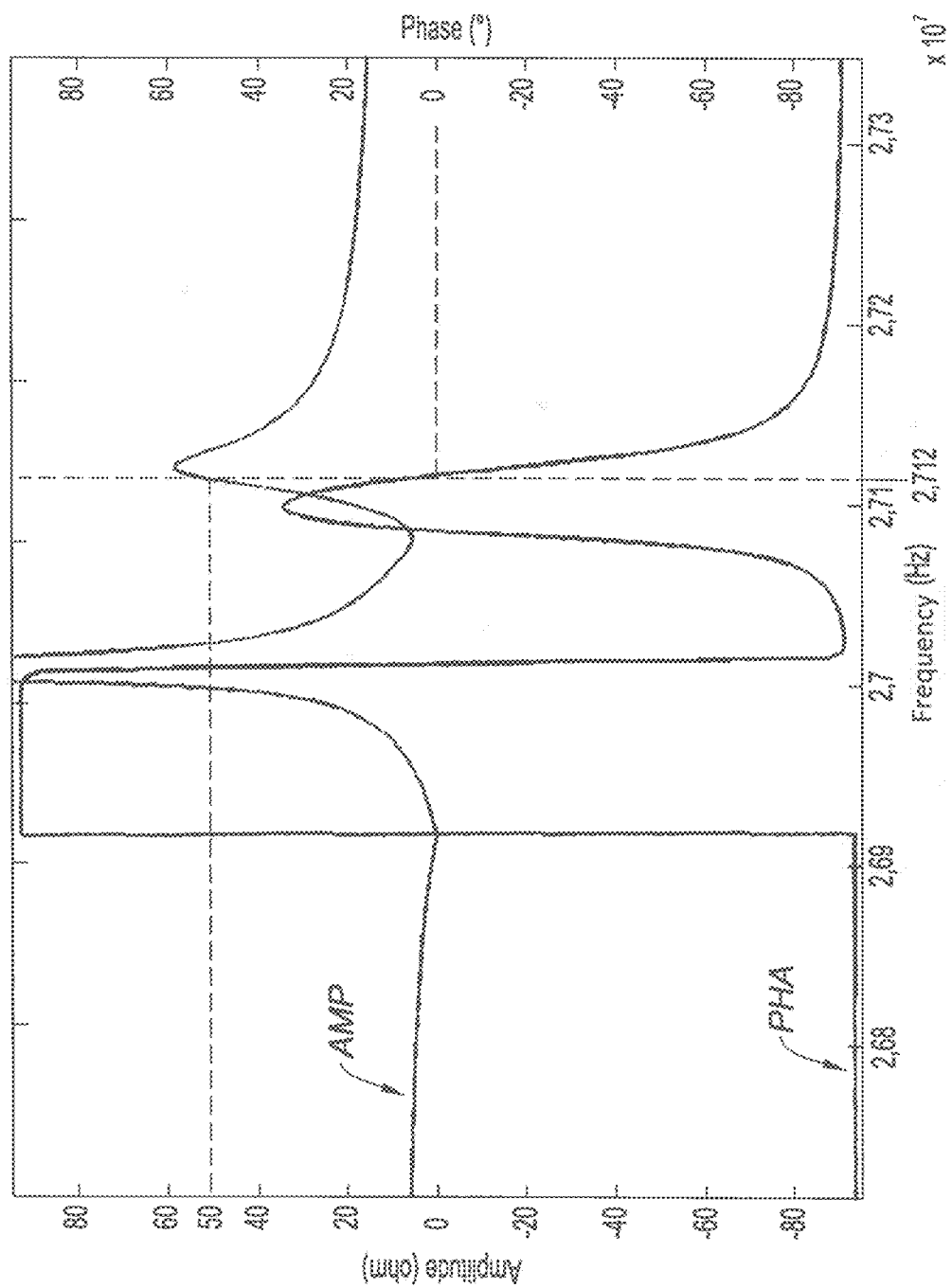
Figure 6C:
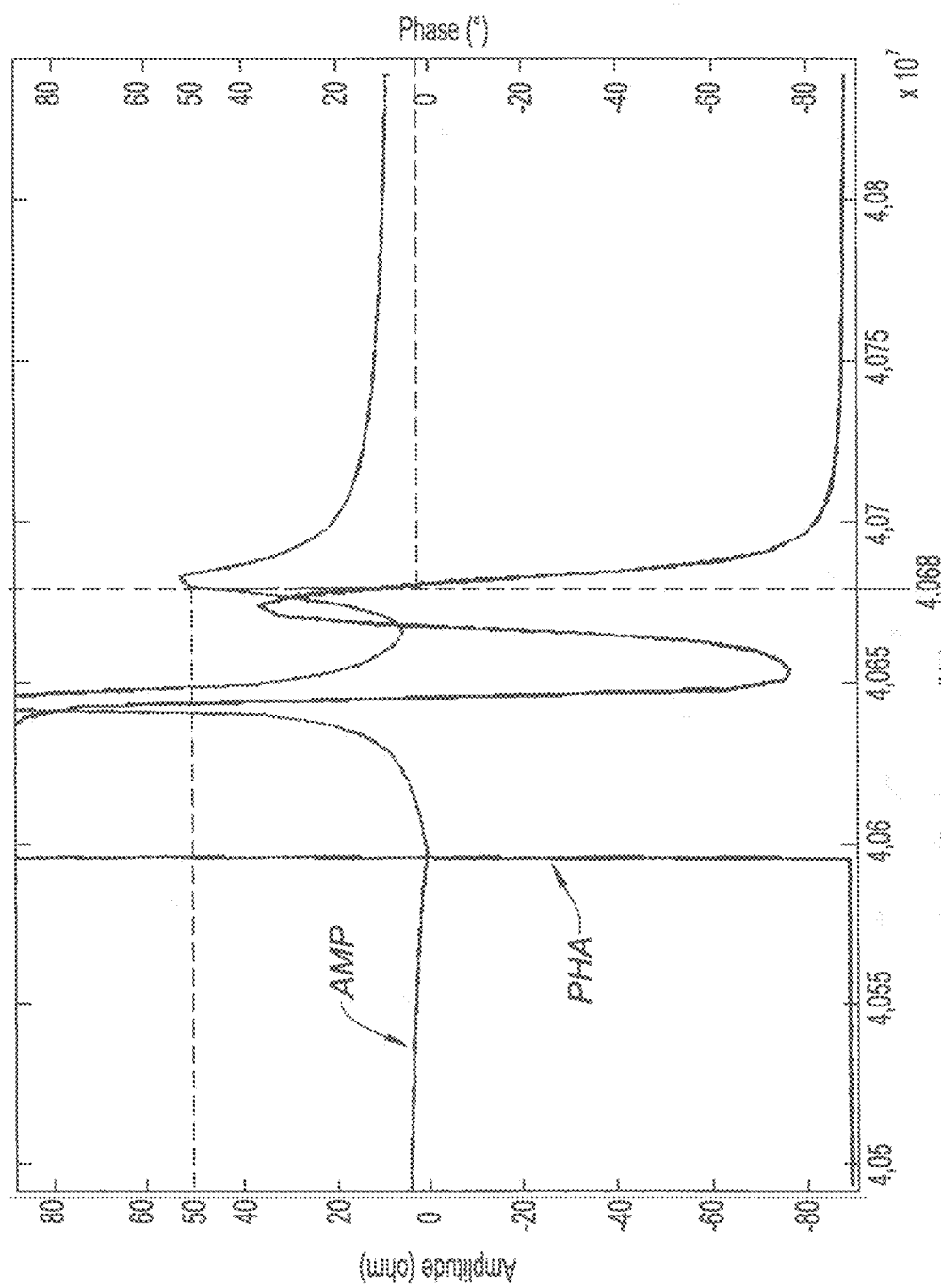

FIGS. 6(a) to 6(c) show the results of a digital simulation conducted with the circuit 100' for impedance matching shown in FIG. 5.

FIGS. 6(b) and 6(c) being views that focus on the frequencies 2f and 3f respectively.

For this simulation, the following conditions were taken into account.

The embodiment of FIG. 5 is used as basis.

The generator G is modelled as having a characteristic impedance of 50 Ohms.

As far as the load CH is concerned, it can be in the form of a capacitively-coupled plasma reactor. Therefore, it is considered to feature variable impedance with the frequency. It is modelled with the following values:

capacity of the load $C_{CH}=700.10^{-12}$ (Farad);
resistance of the load $R_{CH}=5$ (Ohm); et
inductance of the load $L_{CH}=14.10^{-9}$ (Henry).

It should be noted that in order to enable the optimal transmission of power, a load resistance of 5 Ohms is provided.

As far as the circuit C1 ("matchbox") is concerned, it is modelled with the following values:

capacity $C_{load}=7.10^{-10}$ (Farad);
capacity $C_{tune}=3.3.10^{-9}$ (Farad); and
inductance $L_{tune}=4.10^{-7}$ (Henry).

As far as the circuit C2 is concerned, it is modelled with the following values:

capacity $C_{load2}=5.3.10^{-12}$ (Farad); and
inductance $L_{load2}=6.7.10^{-6}$ (Henry).

As far as the circuit C'2 is concerned, the following values are used:

capacity $C'_{load2}=1.3.10^{-8}$ (Farad);
inductance $L'_{load2}=2.7.10^{-9}$ (Henry).

As far as the circuit C3 is concerned, it is modelled with the following values:

capacity $C_{load3}=1.9.10^{-12}$ (Farad);
inductance $L_{load3}=7.9.10^{-6}$ (Henry).

As far as the circuit C'3 is concerned, the following values are used:

capacity $C'_{load3}=10^{-8}$ (Farad);
inductance $L'_{load3}=1.5.10^{-9}$ (Henry).

To establish these values, the approach consists firstly in achieving impedance matching at the frequency f (13.56 MHz). For this purpose, the values of the inductance $L_{tune}$ and of the capacitors $C_{load}$, $C_{tune}$ of the circuit C1 ("matchbox") of FIG. 5 are set by selecting an easily-achievable inductance value, and then by calculating accurate capacity values of each capacitor.

Then, subsequently, the values of the capacitors and inductors of the circuits C2, C'2, C3 and C'3 of the circuit 100' for impedance matching of FIG. 5 are set so that the generator G sees an impedance value of 50 Ohms at the frequencies 2f (27.12 MHz) and 3f (40.68 MHz), with little or no impact on the impedance matching condition of the frequency f (13.56 MHz). No adjustment is performed for the circuit C1 after adding the circuits C2, C'2, C3 and C'3.

FIG. 6 shows the evolution of the phase (PHA, in degrees) and of the amplitude (AMP, in Ohms) of the impedance seen by the generator G based on the frequency (Hz) of the signal. It should be noted that at frequencies f (13.56 MHz), 2f and 3f, the amplitude AMP and the phase PHA feature values that are close, respectively, to 50 Ohms and 0° (see dotted lines), which provides for perfect or nearly perfect impedance matching. This means that similar impedance matching is achieved for these three frequencies f, 2f and 3f, and that this impedance matching is of good quality.

An experimental installation, implementing the embodiment of FIG. 5, was subsequently produced.

The experimental installation is provided with a circuit 100' for impedance matching similar to that of FIG. 5 (real), and its load was modelled by defining its resistance, its capacity and its inductance. Then the reflected power was measured at the input of the experimental installation (input of the assembly 200' of FIG. 5 where the generator is connected), assuming the presence of a generator with a characteristic impedance of 50 Ohms.

It should be noted that the results of the simulation provided usable values for the components of the different circuits C1, C2, C'2, C3 and C'3 of the real circuit 100' for impedance matching.

Figure 7:
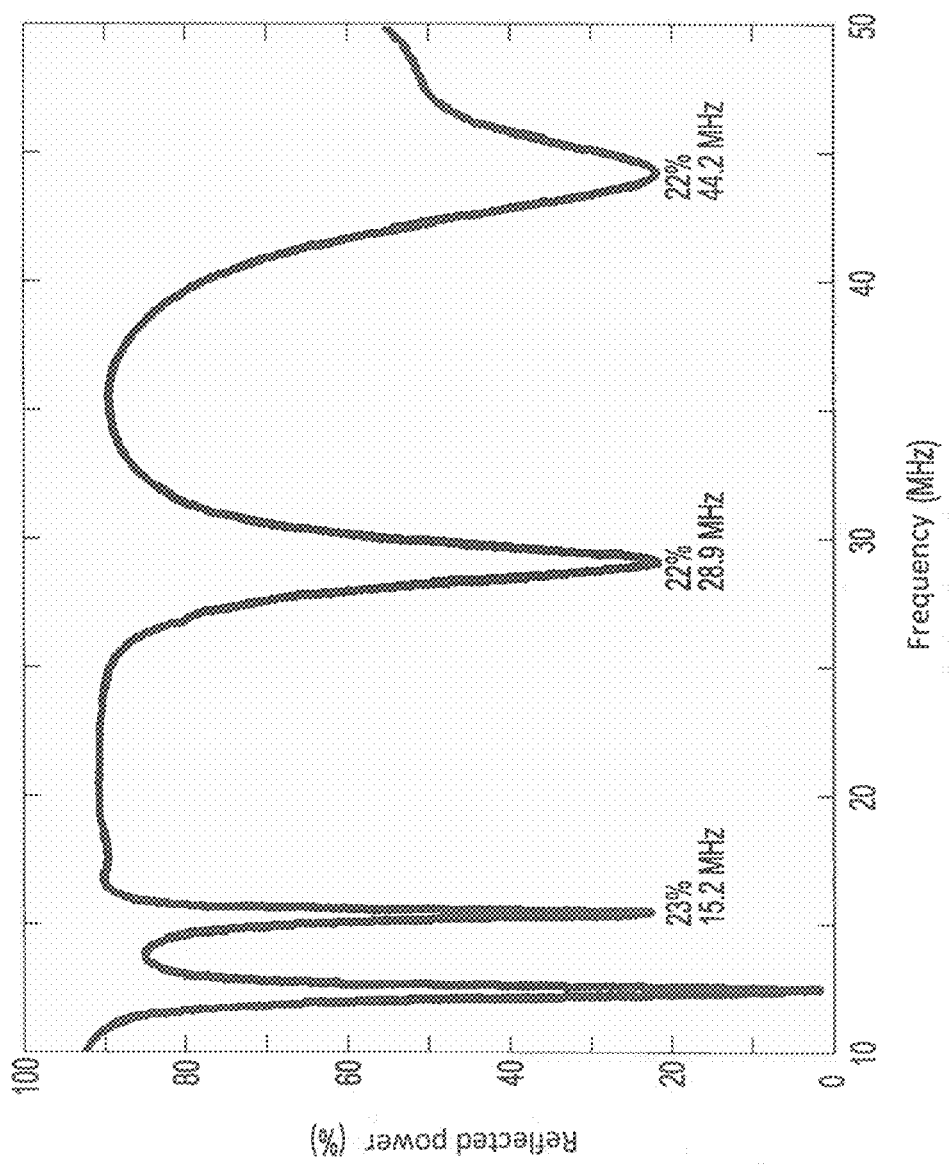
FIG. 7 shows the results of an experimental test performed with the embodiment of FIG. 5.

Furthermore, FIG. 7 shows this measurement (on the Y axis, in % of the injected power) as a function of the frequency (on the X axis).

In this case and with the digital simulation, the presence of three troughs should be noted at the frequencies of 15.2 MHz, 28.9 MHz and 44.2 MHz, with similar low reflection rate values for the three frequencies (reflection rate of about 22%). This confirms, experimentally, the possibilities afforded by the invention for impedance matching at multiple frequencies.

It should be noted that, relating to these experimental results, the frequencies are not exactly 13.56 MHz, 27.12 MHz and 40.68 MHz, but that they are all slightly offset towards higher frequencies. This is due to the presence of parasitic inductances within the implemented experimental installation. This does not call into question the fact that the experimental tests conducted confirm the results of the digital simulation.

Finally, another experimental installation was implemented.

This other experimental installation implements the experimental installation described above, this time using a real plasma reactor as load. It should therefore be understood that the circuit 100' for impedance matching is that shown in FIG. 5.

The characteristics of the plasma reactor are as follows. It is a capacitively-coupled plasma (CCP) reactor provided with electrodes. Each electrode is in the form of a cylinder with a diameter of 10 cm. One of the electrodes is connected to the earth and surrounded by a cylindrical earth shield. The distance between the two electrodes is 3 cm. The considered medium is Argon, at a pressure of 200 mTorr.

Figure 8:
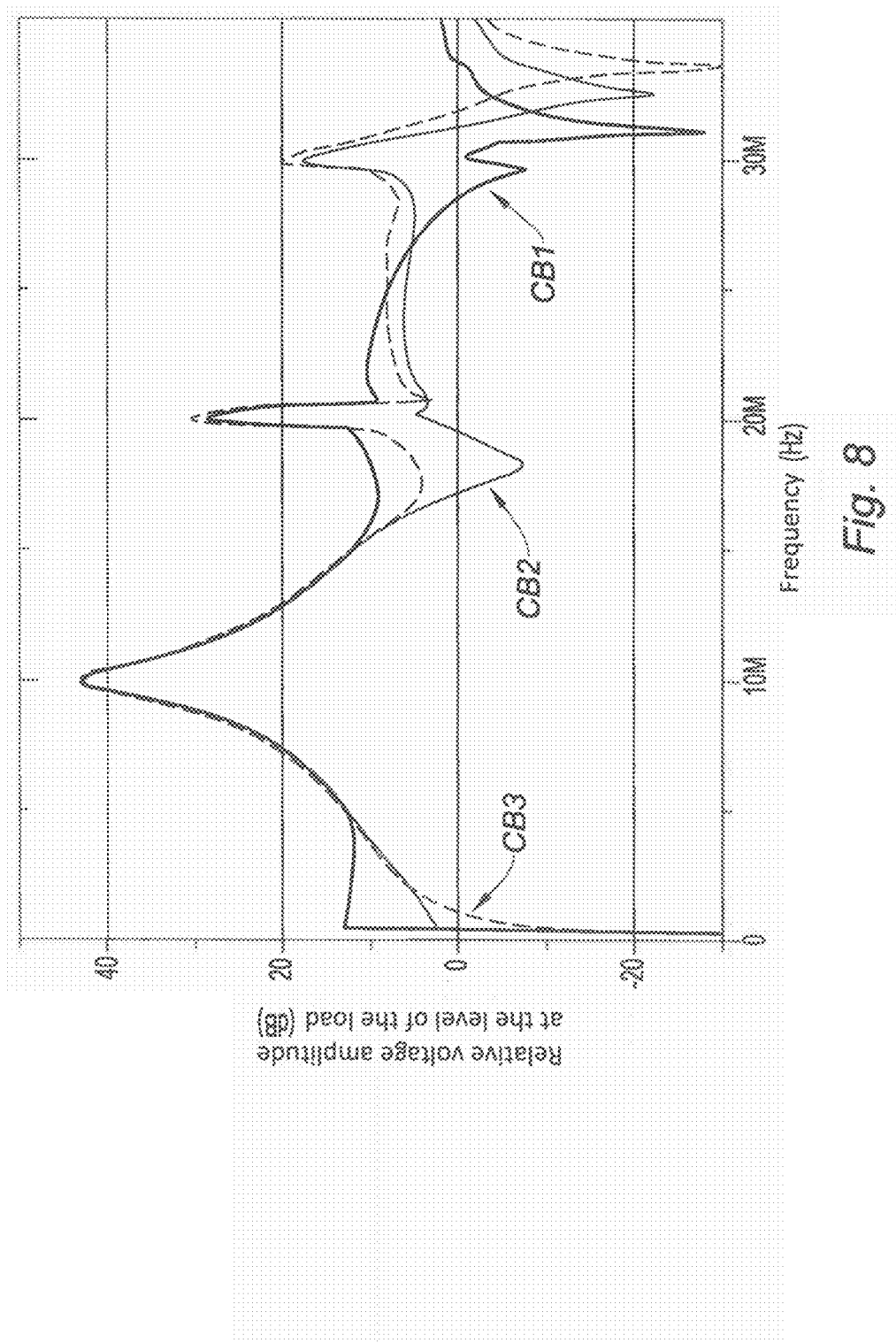
FIG. 8 shows the results of another experimental test performed with the embodiment of FIG. 5.

FIG. 8 shows the Fourier transform of the voltage waveform at the input of the plasma reactor (relative amplitude in dB, on the Y axis) as a function of frequency (X axis). For lack of availability of a sensor suited to the experimental conditions, the reflected power was not measured.

Thus, in FIG. 8, the CB3 curve shows that a good quality of impedance matching can be achieved for the three frequencies 1f, 2f and 3f. This FIG. 7 also shows that impedance matching can be achieved, only for two frequencies 1f and 2f (curve CB1) or 1f and 3f (curve CB2).

It should however be noted in FIG. 8 that the frequency f is approximately 10 MHz. As explained above, this is due to the presence of parasitic inductances and practical issues relating to ill-adapted cabling for the implementation of this experimental installation comprising a real plasma reactor as load.

Nonetheless, these additional experimental results confirm those obtained by digital simulation and with an experimental installation for which the load was modelled.

Figure 9:
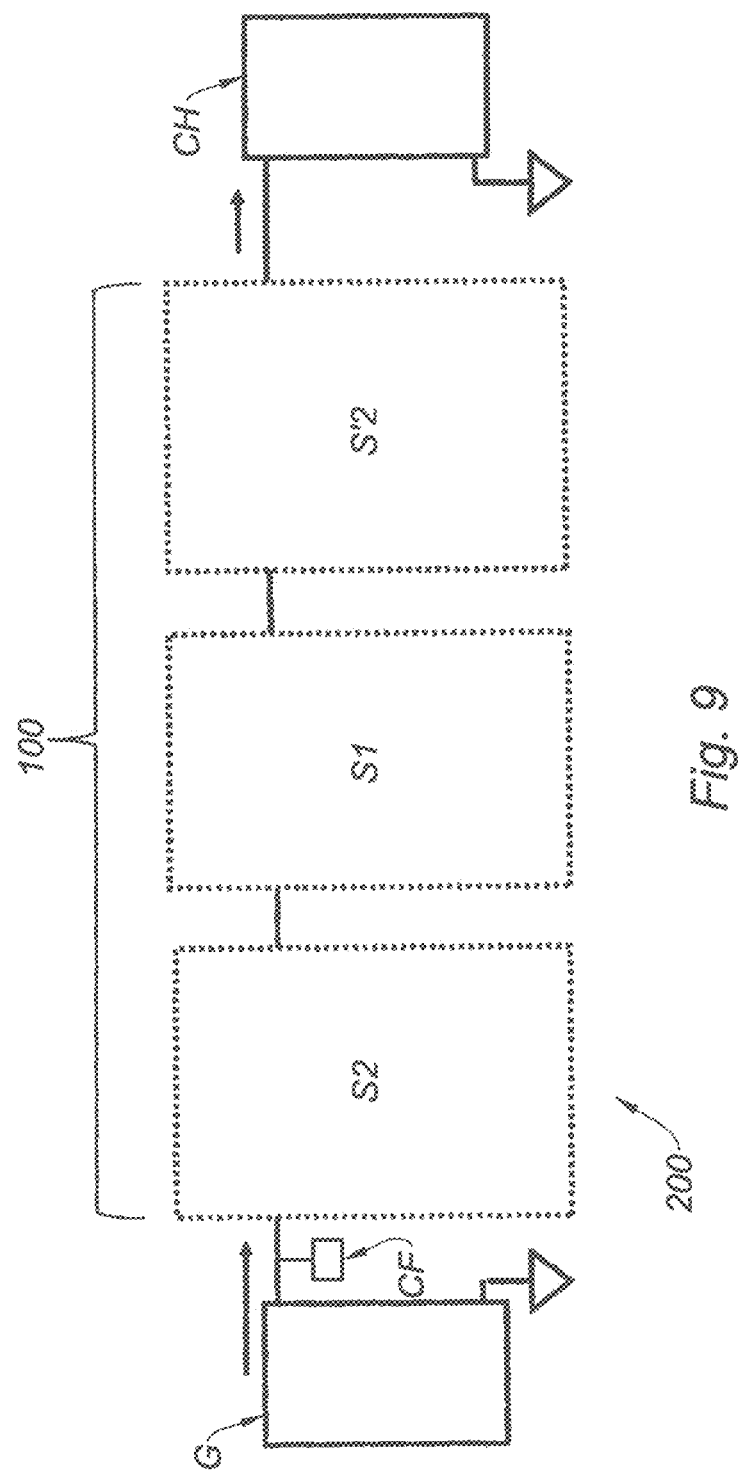
FIG. 9 reproduces FIG. 2 in the case of a frequency sensor being provided at the output of the generator.

It should be noted that, for the purpose of the present invention, and in the context of FIG. 1(*a*), a load impedance $Z_{LOAD}$ and a tuning impedance $Z_{TUNE}$ can be provided for the impedance matching stage S1, which is different to what is more specifically proposed in FIGS. 3 and 5. For example, a supplementary inductance can be provided, after $C_{tune}$, in series with $L_{tune}$ and $C_{tune}$ (FIG. 3, 5 or 9). According to another example, it is possible to remove $L_{tune}$ and keep only $C_{tune}$. In this case, perfect impedance matching at multiple frequencies cannot be guaranteed, but improved tuning at multiple frequencies with respect to the prior art is achievable.

It should also be noted that, for the purpose of the invention, for the impedance matching stage S1, a configuration similar to that of FIG. 1(*b*) or 1(*c*) can be implemented. In these cases, perfect impedance matching at multiple frequencies cannot be guaranteed, but an improved tuning at multiple frequencies with respect to the prior art is also achievable.

The above description relates to circuits wherein the inductor or capacitor values implemented in the circuits enabling processing the frequencies 2f, 3f and following, are constant.

However, it can be particularly interesting to implement, for at least one of the circuits C2, C'2, C3 and C'3, a value of at least either the inductor or the capacitor of at least one of these circuits or of the additional stages S2, S'2; S3, S'3 (it makes no difference) that is adjustable. This renders the circuit 100, 100' more versatile for various types of loads CH (in particular for different types of plasma reactors), of which the characteristic impedance is known (most common case) or not.

In practice, and broadly speaking, the characteristic impedance of the generator G is fixed (known by design). The invention therefore consists, for a given load CH with an associated characteristic impedance value, in achieving impedance matching of the load CH taking into account that of the generator G. Thus, in the above example, the generator G has an impedance of 50 Ohms (most common case) and the load can be of any value, but in the example considered, it is such that its characteristic impedance can be modelled by a capacity $C_{CH}=700.10^{-12}$ Farad and a resistance of $R_{CH}=5$ Ohm.

But the invention also applies in the case of the impedance of the load CH being fixed (known by design), and impedance matching of the generator G taking into account that of the load CH is required. Therefore, using the above example, the load is defined by a characteristic impedance corresponding to a capacity $C_{CH}=700.10^{-12}$ Farad and a resistance of $R_{CH}=5$ Ohm and the generator G would be modelled with a resistance of 50 Ohm. This applies to all of the diagrams of FIGS. 1(*a*), 1(*b*) and 1(*c*). In this case also, the advantage of having adjustable values for the various capacities and inductances is clearly demonstrated as it enables, for a load CH with a known characteristic impedance, to adapt to a generator G, the impedance of which is known (most general case, but in no way the most unconventional case, the conventional case being 50 Ohm) or not.

Finally, the present invention has several advantages.

The solution proposed according to the present invention implements a single generator and requires a reduced number of components to operate efficiently. In other words, with respect to a solution consisting, for N (N>1) multiple frequencies, in providing N generators and as many circuits for impedance matching, as well as N(N−1) filters, the number of components is significantly reduced, and so is the cost.

Furthermore, it should be noted that the solution proposed according to the present invention can be implemented on existing circuits for impedance matching. Indeed, considering for example the basic design shown in FIG. 3, it is simply a matter of adding, with respect to a conventional circuit for impedance matching (stage S1 only), on either side thereof, the stage S2 and the stage S'2 or other stages. This could not be considered with the design disclosed in document WO 2013/186381.

Finally, the design of the circuit 100, 100' for impedance matching between the generator and the load implies that the tuning for a given frequency (for example a harmonic) is independent from the tuning for another frequency (for example the fundamental frequency). With respect to the solution disclosed in document WO 2013/186381, the impedance matching performance is improved.

It should finally be added that each assembly 200, 200' can be modified for the addition, between the generator G and the circuit for impedance matching 100, 100', of a frequency sensor CF. This is shown in FIG. 9, in the case of an application to the assembly 200.

Indeed, with the frequency sensor and for an application involving a capacitively-coupled plasma reactor, said assembly 200, 200' can be used in a specific manner. In this implementation, a power supply signal comprising a single frequency is transmitted towards the capacitively-coupled plasma generator, and the frequency data from the frequency sensor CF is analysed, at its return from the capacitively-coupled plasma reactor, to determine whether the etching process in progress in the plasma reactor is completed or not.

There are already various techniques to determine whether an etching process in progress in the plasma reactor is completed or not. One of these techniques relies on a frequency sensor to detect harmonics associated with plasma instabilities. However, because conventional circuits for impedance matching only accept a single frequency, the sensor is then arranged between the circuit for impedance matching and the plasma reactor, which greatly complicates the measurement.

According to the present invention, a frequency sensor can be positioned at the output of the generator. Furthermore, the sensor can be a basic model.

The invention claimed is:

1. A circuit for impedance matching able to achieve simultaneous impedance matching between a generator (G) and a load (CH) for a supply signal comprising at least one first frequency and one second frequency, both being distinct from one another, said circuit comprising an impedance matching stage (S1) able to achieve impedance matching between the generator and the load for the first frequency, this stage (S1) comprising a circuit (C1) comprising at least a tuning impedance ($Z_{TUNE}$) intended to be arranged in series between the generator (G) and the load (CH) and a load impedance ($Z_{LOAD}$) intended to be arranged between the generator (G) and an earth,
wherein said circuit for impedance matching further comprises at least one pair of additional stages (S2, S'2) able to achieve impedance matching, simultaneously, between the generator and the load for the second frequency, said pair of additional stages (S2, S2') comprising:
a first additional stage (S2) comprising a load circuit (C2) arranged in parallel with respect to the load impedance ($Z_{LOAD}$) of the impedance matching stage (S1), said load circuit (C2) comprising at least an inductance ($L_{load2}$) and a capacitor ($C_{load2}$) arranged in series, and
a second additional stage (S'2) comprising a tuning circuit (C'2) arranged in series with respect to the tuning impedance ($Z_{TUNE}$) of the impedance matching stage (S1), said load circuit (C'2) comprising at least an inductance ($L'_{tune2}$) and a capacitor ($C'_{tune2}$) arranged in parallel,
the impedance matching stage (S1) furthermore being arranged between the first additional stage (S2) and the second additional stage (S'2)
and wherein said circuit for impedance matching further comprises at least one supplementary pair of additional stages able to achieve impedance matching, simultaneously, between the generator and the load for a third frequency, distinct from said first and second frequencies, said at least one supplementary pair of additional stages (S3, S'3) comprising:
a first supplementary additional stage (S3) comprising a load circuit (C3) arranged in parallel with respect to the load impedance ($Z_{TUNE}$) of the impedance matching stage (S1), said load circuit (C3) comprising at least an inductance ($L_{load3}$) and a capacitor ($C_{load3}$) arranged in series,
a second supplementary additional stage (S'3) comprising a tuning circuit (C'3) arranged in series with respect to the tuning impedance ($Z_{TUNE}$) of the impedance matching stage (S1), said load circuit (C'3) comprising at least an inductance ($L'_{tune3}$) and a capacitor ($C'_{tune3}$) arranged in parallel,
the assembly formed by the impedance matching stage (S1) and by the pair of additional stages (S2, S'2) furthermore being arranged between the first supplementary additional stage (S3) and the second supplementary additional (S'3) stage.

2. The circuit according to claim 1, wherein the value of at least either the inductance or the capacitor of at least one of the additional stages (S2, S'2; S3, S'3) can be adjusted.

3. The circuit according to claim 1, wherein the circuit (C1) of the impedance matching stage (S1) comprises a tuning impedance ($Z_{TUNE}$) intended to be arranged in series between the generator (G) and the load (CH), and a load impedance ($Z_{LOAD}$) intended to be arranged between the generator (G) and said earth.

4. The circuit according to claim 3, wherein the tuning impedance ($Z_{TUNE}$) comprises an inductance ($L_{tune}$) arranged in series with a capacitor ($C_{tune}$) and the load impedance ($Z_{load}$) comprises a capacitor ($C_{load}$).

5. The circuit according to claim 4, wherein the tuning impedance ($Z_{TUNE}$) consists of an inductor ($L_{tune}$) arranged in series with a capacitor ($C_{tune}$) and the load impedance ($Z_{load}$) consists of a capacitor ($C_{load}$).

6. A circuit for impedance matching able to achieve simultaneous impedance matching between a generator (G) and a load (CH) for a supply signal comprising at least one first frequency and one second frequency, both being distinct from one another, said circuit comprising an impedance matching stage (S1) able to achieve impedance matching between the generator and the load for the first frequency, this stage (S1) comprising a circuit (C1) comprising at least a tuning impedance ($Z_{TUNE}$) intended to be arranged in series between the generator (G) and the load (CH) and a load impedance ($Z_{LOAD}$) intended to be arranged between the generator (G) and an earth,
wherein said circuit for impedance matching further comprises at least one pair of additional stages (S2, S'2) able to achieve impedance matching, simultaneously, between the generator and the load for the second frequency, said pair of additional stages (S2, S2') comprising:
a first additional stage (S2) comprising a load circuit (C2) arranged in parallel with respect to the load impedance ($Z_{LOAD}$) of the impedance matching stage (S1), said load circuit (C2) comprising at least an inductance ($L_{load2}$) and a capacitor ($C_{load2}$) arranged in series, and
a second additional stage (S'2) comprising a tuning circuit (C'2) arranged in series with respect to the tuning impedance ($Z_{TUNE}$) of the impedance matching stage (S1), said load circuit (C'2) comprising at least an inductance ($L'_{tune2}$) and a capacitor ($C'_{tune2}$) arranged in parallel,
the impedance matching stage (S1) furthermore being arranged between the first additional stage (S2) and the second additional stage (S'2), wherein the circuit (C1) further comprises another load impedance ($Z'_{LOAD}$) intended to be arranged between the load (CH) and said earth so that the tuning impedance ($Z_{TUNE}$) is arranged between the two load impedances ($Z_{LOAD}$, $Z'_{LOAD}$).

7. A circuit for impedance matching able to achieve simultaneous impedance matching between a generator (G) and a load (CH) for a supply signal comprising at least one first frequency and one second frequency, both being distinct from one another, said circuit (100) comprising an impedance matching stage (S1) able to achieve impedance matching between the generator and the load for the first frequency, this stage (S1) comprising a circuit (C1) comprising at least a tuning impedance ($Z_{TUNE}$) intended to be arranged in series between the generator (G) and the load (CH) and a load impedance ($Z_{LOAD}$) intended to be arranged between the generator (G) and an earth, wherein said circuit for impedance matching further comprises at least one pair of additional stages (S2, S'2) able to achieve impedance matching simultaneously, between the generator and the load for the second frequency, said pair of additional stages (S2, S2') comprising:

a first additional stage (S2) comprising a load circuit (C2) arranged in parallel with respect to the load impedance ($Z_{LOAD}$) of the impedance matching stage (S1), said load circuit (C2) comprising at least an inductance ($L_{load2}$) and a capacitor ($C_{load2}$) arranged in series, and a second additional stage (S'2) comprising a tuning circuit (C'2) arranged in series with respect to the tuning impedance ($Z_{TUNE}$) of the impedance matching stage (S1), said load circuit (C'2) comprising at least an inductance ($L'_{tune2}$) and a capacitor ($C'_{tune2}$) arranged in parallel, the impedance matching stage (S1) furthermore being arranged between the first additional stage (S2) and the second additional stage (S'2), wherein the circuit (C1) further comprises another tuning impedance ($Z'_{TUNE}$) intended to be arranged in series between the generator (G) and the load (CH) so that the load impedance ($Z_{LOAD}$) is arranged between the two tuning impedances ($Z_{TUNE}$, $Z'_{TUNE}$).

8. An assembly comprising:
a load (CH), and
a generator (G) able to transmit to the load a power supply signal comprising at least a first frequency and a second frequency distinct from one another,
wherein said assembly further comprises a circuit for impedance matching able to achieve simultaneous impedance matching between a generator (G) and a load (CH) for a supply signal comprising at least one first frequency and one second frequency, both being distinct from one another, said circuit comprising an impedance matching stage (S1) able to achieve impedance matching between the generator and the load for the first frequency, this stage (S1) comprising a circuit (C1) comprising at least a tuning impedance ($Z_{TUNE}$) intended to be arranged in series between the generator (G) and the load (CH) and a load impedance ($Z_{LOAD}$) intended to be arranged between the generator (G) and an earth, wherein said circuit for impedance matching further comprises at least one pair of additional stages (S2, S'2) able to achieve impedance matching, simultaneously, between the generator and the load for the second frequency, said pair of additional stages (S2, S2') comprising:

a first additional stage (S2) comprising a load circuit (C2) arranged in parallel with respect to the load impedance ($Z_{LOAD}$) of the impedance matching stage (S1), said load circuit (C2) comprising at least an inductance ($L_{load2}$) and a capacitor ($C_{load2}$) arranged in series, and a second additional stage (S'2) comprising a tuning circuit (C2) arranged in series with respect to the tuning impedance ($Z_{TUNE}$) of the impedance matching stage (S1), said load circuit (C'2) comprising at least an inductance ($L'_{tune2}$) and a capacitor ($C'_{tune2}$) arranged in parallel, the impedance matching stage (S1) furthermore being arranged between the first additional stage (S2) and the second additional stage (S'2), said circuit being arranged between the generator (G) and the load (CH) so that, on the one hand, the first additional stage (S2, S3) that comprises the outermost load circuit (C2, C3) of said circuit for impedance matching is connected to the generator (G), and on the other hand, the second additional stage (S'2, S'3) that comprises the outermost tuning circuit (C'2, C'3) of said circuit for impedance matching is connected to the load (CH).

9. The assembly according to claim 8, wherein the first frequency is a fundamental frequency of said power supply signal and the second frequency, and as necessary any additional frequency, is one of its harmonics.

10. The assembly according to claim 8, wherein said assembly includes a frequency sensor (CF) located between the generator (G) and said circuit for impedance matching.

11. The assembly according to claim 8, wherein the load (CH) is a capacitively-coupled plasma reactor.

* * * * *